United States Patent [19]
Axelson et al.

[11] Patent Number: 6,012,303
[45] Date of Patent: Jan. 11, 2000

[54] EUTECTIC BONDING OF SINGLE CRYSTAL COMPONENTS

[75] Inventors: Scott R. Axelson, Brookline; Herbert E. Bates, Milford; Joseph M. Collins, Wilton; Jeremiah J. Fitzgibbon, Bedford, all of N.H.; John W. Locher, Sterling, Mass.; Brian J. McAndrews, Brookline, N.H.

[73] Assignee: Saphikon, Inc., Milford, N.H.

[21] Appl. No.: 08/872,946

[22] Filed: Jun. 11, 1997

[51] Int. Cl.[7] ....................................................... H01K 1/36
[52] U.S. Cl. ................................. 65/36; 156/89; 156/297; 156/300; 264/DIG. 57; 428/432; 428/697; 428/699; 428/701; 428/702
[58] Field of Search ................................... 65/36, 42, 43; 264/DIG. 57; 156/89, 297, 300; 428/432, 697, 699, 701, 702

[56] References Cited

U.S. PATENT DOCUMENTS

| | | | |
|---|---|---|---|
| 3,833,349 | 9/1974 | Arendt | 65/43 |
| 3,993,844 | 11/1976 | Kiger et al. | 428/446 |
| 4,412,963 | 11/1983 | Hing | 264/61 |
| 4,447,283 | 5/1984 | Ebata | 156/325 |
| 5,352,385 | 10/1994 | Yanagida et al. | 252/521 |

*Primary Examiner*—Archene Turner
*Attorney, Agent, or Firm*—Lahive & Cockfield, LLP

[57] ABSTRACT

The present invention provides for a method and articles produced from this method for eutectically bonding together single crystal elements, such as sapphire, to form a strong bond therebetween which can withstand high temperatures and chemical attack. The eutectic bonding mixture of the present invention can include a Group IIIA compound, such as yttria.

26 Claims, 2 Drawing Sheets

EUTECTIC BONDING OF SINGLE CRYSTAL COMPONENTS

BACKGROUND OF THE INVENTION

The present invention relates to forming high strength bonds between similar elements, and particularly to eutectically bonding together single crystal elements.

Today's burgeoning technology employs sapphire in applications other than as a mere gemstone. For example, sapphire can be used as windows in supermarket checkouts, can be used to form electrostatic chucks, which are typically used to clamp semiconductor wafers within an implantation chamber during processing, or used for rocket nosecones. Sapphire is particularly suited for such use with electrical apparatus since its single crystal lattice structure tends not to become permanently polarized over time.

The differing uses of sapphire have created a need for the ability to join single crystal elements such as sapphire together in a manner that creates a strong and stable bond, as well as a bond that can withstand any harsh environmental factors that the sapphire laminate may be exposed to. The art has attempted to meet this need by developing eutectic bonding mixtures that bond together particular components.

There still exists a need in the art, however, for improved bonding mixtures that create a stable bond between single crystal elements. There further exists a need for bonding mixtures which create a relatively strong bond and which are highly resistant to temperature and chemical attack.

Hence, one object of the present invention is to employ a eutectic bonding mixture for joining single crystal elements that can withstand high temperatures and chemical attacks.

It is another object of the invention to employ a eutectic bonding mixture to form a relatively strong hermetic seal between single crystal elements.

Other general and more specific objects of the invention will in part be obvious and will in part appear from the drawings and description which follow.

SUMMARY OF THE INVENTION

The present invention provides for methods and articles formed from such methods for eutectically bonding together single crystal elements, such as sapphire, to form a strong bond therebetween which can withstand high temperatures and chemical attack. The resultant article has relatively high electrical resistance, and thus can be used in high voltage applications. The foregoing is achieved with a eutectic bonding mixture according to the present invention that includes a Group IIIA compound, and preferably an yttrium-containing compound, for bonding together single crystal elements.

According to one aspect, the eutectic bonding mixture can include one or more Group IIIA compounds, and is preferably mixed with aluminum oxide. The use of aluminum oxide closely matches particular characteristics of the single crystal elements, such as thermal expansion coefficients, thus forming an article that is less likely to crack during heating and cooling.

According to another aspect, the yttrium-containing compound can include either yttria ($Y_2O_3$) or yttrium aluminum garnet, $Y_3Al_5O_{12}$, (YAG).

According to still another aspect, the yttrium-containing compound includes a slurry formed from about 4 parts solid $Y_2O_3$ by weight and about one part of a suitable carrier fluid by weight, such that $Y_2O_3$ is present in the amount of about 81.5% by weight and $Al_2O_3$ is present in the amount of about 18.5% by weight. The carrier fluid can include methanol. According to another aspect, the yttrium-containing compound can include a slurry formed of about 4 parts solid, mainly yttrium aluminum garnet, by weight and one part of a suitable carrier fluid by weight.

According to still another aspect, the single crystal elements are etched prior to coating with the eutectic bonding mixture to clean residue and contaminants therefrom. The coated elements are then heated to a temperature and for a time sufficient to melt the bonding mixture without melting the elements. The heated elements are then cooled, and when the binding mixture solidifies, it bonds together the elements.

The present invention also provides for articles produced by the foregoing process.

BRIEF DESCRIPTION OF THE DRAWINGS

The foregoing and other objects, features and advantages of the invention will be apparent from the following description and apparent from the accompanying drawings, in which like reference characters refer to the same parts throughout the different views. The drawings illustrate principles of the invention and, although not to scale, show relative dimensions.

DESCRIPTION OF ILLUSTRATED EMBODIMENTS

The present invention relates to an improved article 10 produced by a method in accordance with the teachings of the present invention. Article 10 is formed by eutectically bonding together single crystal elements with a selected eutectic mixture. The eutectic mixture becomes fluid at a particular bonding temperature below the melting temperature of the articles to be joined.

Figure 1:
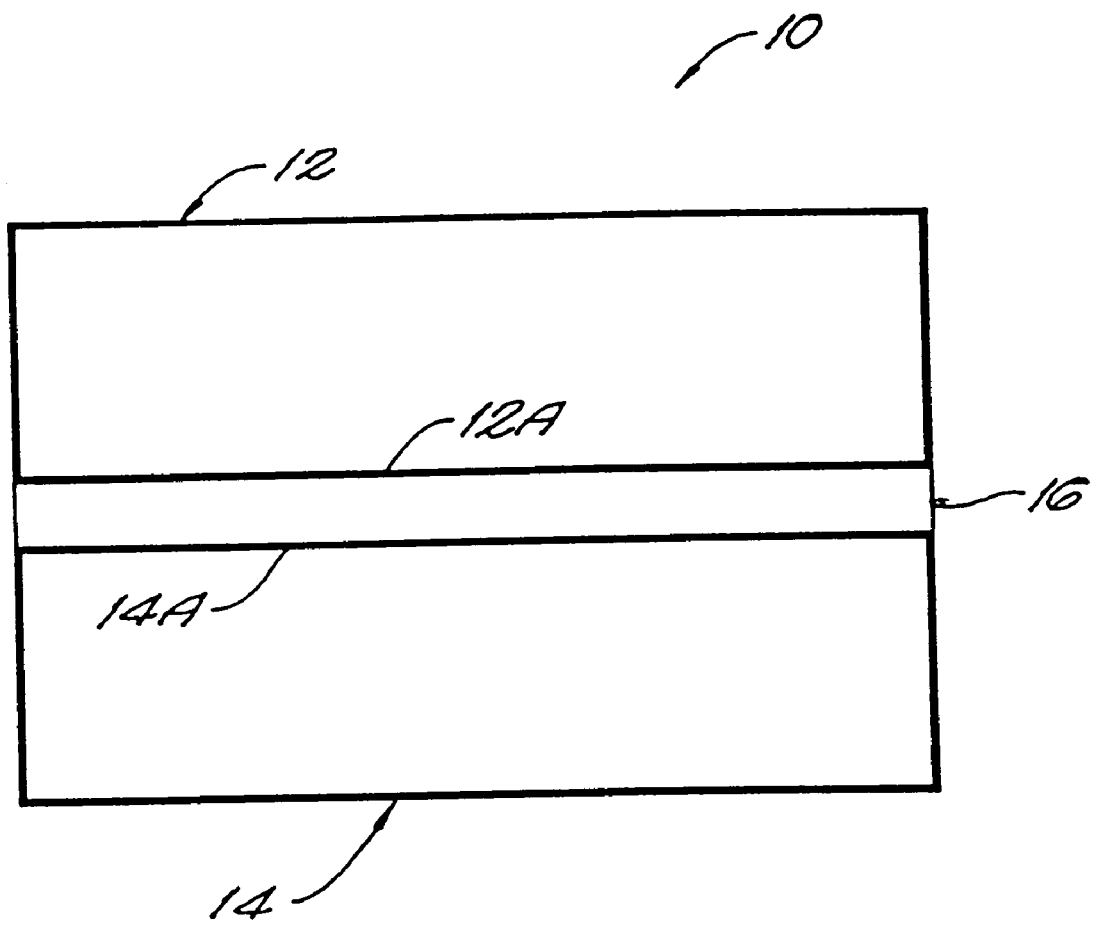
FIG. 1 shows a cross-sectional view of an article formed from a pair of single crystal components eutectically bonded together according to the teachings of the present invention.

FIG. 1 illustrates an article 10 formed by eutectically bonding together particular components 12, 14. The illustrated article 10 includes an upper single crystal element 12 and a lower single crystal element 14. A top surface 14A of the lower single crystal element 14 has applied thereto a bonding layer 16. A bottom surface 12A of the upper single crystal layer element 12 also contacts the bonding layer 16. The single crystal elements 12, 14 are bonded together by heating the bonding layer 16 to form a high strength eutectic bond that is resistant to high temperatures and corrosive chemical attack, as described in further detail below.

The illustrated single crystal elements 12, 14 can include quartz and magnesium oxide, and preferably are aluminum oxide ($Al_2O_3$) compounds such as sapphire. The single crystal aluminum oxide used in accordance with the teachings of the present invention can be formed by conventional manufacturing processes, such as those described in U.S. Pat. No. 3,591,348 of LaBelle, Jr., U.S. Pat. No. 3,687,633 of LaBelle, Jr., et al., U.S. Pat. No. 3,826,625 of Bailey, and U.S. Pat. No. 3,953,174 of LaBelle, Jr., the teachings of which are hereby incorporated by reference.

The thickness of the illustrated bonding layer 16 is exaggerated for illustrative clarity since the smallest quantity of eutectic mixture consistent with providing a strong bond between adjacent single crystal components should be utilized. The bonding layer 16 can hence have a thickness in the range between about 10 μm and about 125 μm, depending upon the closeness of fit of the single crystal components.

The illustrated bonding layer 16 can include a mixture of one or more eutectic compounds. The eutectic compounds, when used either alone or in combination with the other compounds, have a melting temperature below that of the single crystal elements. According to the present invention, when the single crystal elements are sapphire, it is preferable that the eutectic bonding layer 16 have a melting temperature below about 2000° C. Referring again to FIG. 1, the bonding layer 16 can include one or more Group IIIA compounds, and preferably includes an yttrium-containing compound or oxides or derivatives thereof. The preferred yttrium-containing compound are yttrium oxide or yttria ($Y_2O_3$) or yttrium aluminum garnet (YAG). According to a preferred practice, the yttrium-containing compound can be mixed with aluminum oxide ($Al_2O_3$).

The illustrated bonding layer 16 includes one or more compounds that are either in powder form, mixed in a slurry, or in a gel or sol form. If the bonding layer 16 comprises a slurry, one or more of the foregoing compounds such as yttriia or YAG can be mixed with a suitable carrier fluid, such as water or methanol to form a slurry. For example, four parts $Y_2O_3$ powder or four parts YAG powder containing 81.5% $Al_2O_3$ and 18.5% $Y_2O_3$ can be mixed with one part methanol and/or water to form a slurry. The slurry can be applied to one or both of the single crystal components, such as the bottom component 14, by either dipping the component 14 into the slurry, troweling the slurry onto the top surface 14A, or by pushing, syringing or spraying the slurry on the component. Those of ordinary skill will recognize that additional quantities of water can be added during the application process to provide varying rheological properties to the slurry suitable to different application means.

In order to ensure homogeneity in the eutectic bonding layer, it is desirable to use powders of relatively fine particle size, and preferably includes particles having a size in the range between about 0.1 μm and about 100 μm.

A significant advantage of the eutectic bonding layer 16 which employs a Group IIIA compound is that it forms a high strength bond between the single crystal elements 12, 14, thus forming a stable composite article 10 that is extremely tolerant of relatively high temperatures and chemical attack. The bonding layer also forms a highly electrically insulative layer, thus allowing the article to be used in high voltage environments.

The use of yttria in the eutectic bonding mixture of the invention provides several unique advantages. One advantage is that the yttrium-containing bonding layer 16 forms a eutectic bond that closely matches the thermal expansion characteristics of the single crystal elements. Furthermore, the chemical structure of yttria is better suited to accommodate modifier ions that alter its characteristics relative to conventional compounds, such as zirconia. The ability to alter the characteristics of yttria enables the user to tailor the properties of the bonding mixture to a particular application. For example, closely matching the thermal expansion coefficient of the single crystal elements and the eutectic compound helps preserve the mechanical integrity of the article 10 during heating and cooling.

While the Group IIIA compounds are preferred, in some circumstances the bonding layer 16 can include (or even be primarily) other compounds, such as a Group IIA or a lanthanide series compound, as of lanthanum and neodymium, and oxides and derivatives thereof. The illustrated bonding layer 16 can also employ one or more non-metal compounds, including carbides and nitrides of Group IIIA and IIIB metals, and of the lanthanide series.

One or more of the foregoing compounds can be used alone, or can be mixed with any other of the foregoing compounds or with aluminum oxide ($Al_2O_3$).

Figure 2:
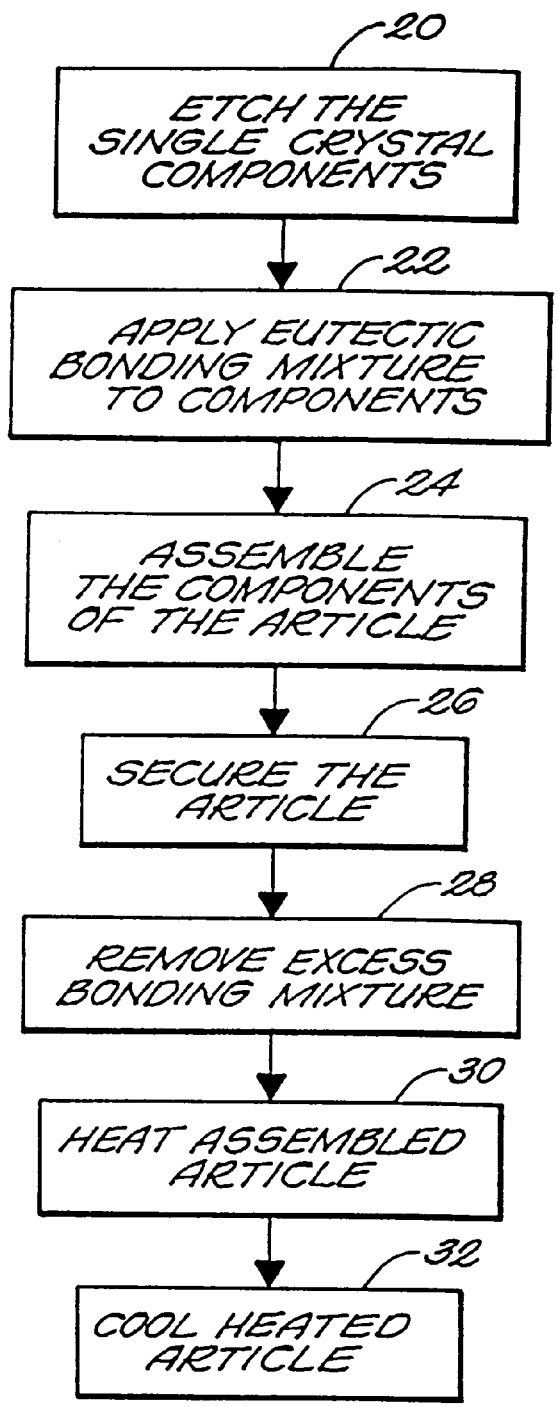
FIG. 2 is a schematic flow-chart depiction of the process for forming the article of FIG. 1 according to the teachings of the present invention.

FIG. 2 illustrates in flow-chart form the method of the present invention for forming a eutectic bond between single crystal elements, such as sapphire components. The components can be etched to remove any surface contaminants via any suitable media, such as by a mixture of nitric and hydrofluoric acids, as set forth in step 20. One of the single crystal components is then coated with a eutectic bonding mixture, which can comprise one or more Group IIIA compounds, as shown in step 22. According to a preferred practice, the eutectic bonding mixture includes an yttrium-containing compound, or a mixture of an yttrium-containing compound and aluminum oxide. The use of aluminum oxide provides a eutectic bond that more closely matches the thermal expansion coefficient of the sapphire components.

Once the sapphire component is coated with the eutectic bonding mixture, the sapphire components are assembled and the resultant unheated composite article is placed in any suitable securing apparatus, such as an appropriate jig, to hold the bonding surfaces in intimate contact. This is illustrated in steps 24 and 26. As illustrated in step 28, the non-bonding surfaces of the sapphire components 12, 14 can be thoroughly cleaned to remove excess bond material prior to heating. The excess bonding compound can be removed from any surface of the sapphire components using any suitable media, such as paper towels, cotton swabs and suitable cleaning solutions such as methanol. The cleaning solutions preferably do not negatively react with the sapphire components or with the bonding mixture.

The composite article is then heated to a selected suitable temperature sufficient to melt the eutectic mixture but below the melting point of the sapphire components, e.g., below 2050° C. According to a preferred practice, and as shown in step 30, the assembled article is subjected to temperatures below the resulting point of the single crystal elements, and is preferably exposed to temperatures in the range between about 1800° C. and 1950° C., and most preferably between about 1830° C. and about 1900° C. Those of ordinary skill will recognize that the melting temperature of the eutectic bonding mixture is a function of the particular constituent compounds of the mixture.

The dwell time of the article 10, upon attaining the maximum temperature, is also a function of the particular compounds employed in the eutectic bonding mixture. According to a preferred practice, the article is heated for a time in the range between about 1 minute and about 100 minutes, and preferably between about 15 minutes and about 60 minutes. For example, if the eutectic bonding mixture includes a mixture of aluminum oxide and yttrium oxide, the article is heated above about 1834° C. for about 15 minutes, with the maximum attained temperature being about 1880° C. The article components 12, 14 are preferably maintained at the eutectic melting temperature for a period of time sufficient to ensure complete melting of the eutectic bonding layer, and according to this example, is maintained at this temperature for approximately one minute or longer. Those of ordinary skill knowing the particular constituents of the eutectic bonding mixture will be able to determine the melting point of the mixture from known phase diagrams, as well as the appropriate dwell time without undue experimentation.

During the heating process, the force applied to the article by the jig helps exclude entrapped gases from forming within the bond, thus ensuring the formation of a high strength bond between the sapphire components.

After the article 10 is heated, and the bonding layer is completely melted and maintained thereat for a sufficient period of time, the article is then cooled at a rate sufficient to extract heat therefrom without affecting the structural integrity of the article 10 and to arrest any further reaction. This is illustrated in step 32. The parts are cooled according to known techniques and at known cool down rates, and are preferably cooled at a rate between about 5° C./min and about 10° C./min. When the eutectic bonding mixture includes an yttrium-containing compound and aluminum oxide, the article can be cooled at a rate approaching about 8° C. per minute to room temperature. Those of ordinary skill will readily recognize that the cooling rate is a function of the particular components being bonded together, as well as the use and type of the resulting product.

The practice of the present invention eutectically bonds together single crystal components, such as sapphire, to produce a bond having relatively high strength and which is highly resistant to chemical attack. The following non-restrictive examples exemplify these features.

EXAMPLE

Example 1

Alumina-Yttria Sol Preparation for Bonding Sapphire Components

A colloidal suspension or sol is stoichiometrically prepared using a powdered water dispersible alumina hydrate, such as aluminum oxide, and yttria ($Y_2O_3$). The compounds are allowed to mix until the compounds are well dispersed within the sol. The sol is produce by adding 150 ml of deionized water to the above compounds in a container. Approximately 20 g of a boehmite or pseudo-boehmite material, such Condea Dispersal Sol P2, is added in 10 g increments, while continuously agitating the solution within the container to disperse the hydrated alumina. The pH of the solution should be maintained at approximately 5. About 25 g of yttria is added to this mixture in three approximately equal portions. The pH of the mixing solution gradually increases to greater than 9. This alkaline solution within the container is then mixed with approximately 10 ml of deionized water. The container is then covered to prevent the evaporation of water and to allow continued mixing of the solution for a minimum of approximately 6 hours. At the end of this time, the sol is thickened and the aluminum oxide and yttria stay in suspension upon cessation of mixing.

The embonding sol is applied to one or more sapphire components by adding between about 50 and 100 ml of deionized water to the above suspension to increase the fluidity for subsequent application. The sol is strained through a 74 mesh Teflon screen to remove any large particles in the solution. A modeler's airbrush, such as Badger Model 250 mini-spray gun, is used to apply the bonding sol to a surface of one of the sapphire components. Specifically, the diluted sol is drawn into a fine Teflon tube of the spray gun, and inert gas, preferably pressurized to approximately 30 psi, is used as the propellant to atomize the solution during spraying.

The sapphire, prior to being coated with the solution, is etched with nitric acid and hydrofluoric acid to remove any surface contaminants or residues. The sol is then applied in passes starting at the top and moving from side to side, where one pass is made for each vertical inch of surface. The piece is then rotated 90° and the coating sequence is repeated. The opposing face is coated with the bonding sol by the same procedure. The coated surfaces of the sapphire component are then allowed to air dry. The surfaces to be bonded together are placed in direct contact and/or securely held together to prevent movement relative to each other.

The sapphire pieces are then heated in a vacuum furnace having a metal or graphite hot zone that is capable of achieving temperatures in excess of 1900° C. The sapphire package is placed on a molybdenum platen within the furnace. Refractory metal is placed on the top surface and serves as the contact point for the application of pressure. The sapphire package is then heated, in vacuum, to about 1880° C. at a ramp up rate between about 5° C./min and about 10° C./min, and preferably in this example at about 8° C./min, with a dwell or soak time of between about 15 minutes and about 60 minutes, and in this example preferably at about 15 minutes. This heating process consumes about 400 minutes. The furnace is then allowed to cool to room temperature at a ramp down rate between about 5° C./min and about 10° C./min, and preferably at about 8° C./min.

The sapphire components are eutectically bonded together by the melting and the subsequent re-solidification of the bonding layer. This bonding layer forms an eutectic bond having relatively high strength and is relatively impermeable to chemicals, i.e., is capable of withstanding aggressive chemical attack. Additionally, the use of aluminum oxide and yttria provide for a eutectic bonding mixture that closely matches particular characteristics of the sapphire components, such as thermal expansion rates, while concomitantly forming a bond that has high electrical resistivity and can withstand chemical attack.

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

Having described the invention, what is claimed as new and desired to be secured by Letters Patent is:

1. A method for bonding a plurality of single crystal elements together, comprising applying a eutectic bonding material having Group IIIA compound as its major active component to one interface of one of said plurality of single crystal elements, placing an interface of one of said other single crystal elements in contact with said eutectic bonding material to form a pre-heating assembly, and heating said assembly to a selected temperature sufficient to eutectically bond said single crystal elements together.

2. The method of claim 1 wherein said Group IIIA compound comprises an yttrium-containing compound.

3. The method of claim 2 wherein said yttrium-containing compound comprises a slurry formed of 4 parts by weight of a yttrium-containing compound selected from the group consisting of one of YAG and $Y_2O_3$ and one part of a carrier fluid by weight.

4. The method of claim 2 wherein said yttrium-containing compound comprises yttrium oxide.

5. The method of claim 3 further comprising the step of mixing together $Al_2O_3$ with said $Y_2O_3$ to form a bonding mixture prior to said heating step.

6. The method of claim 1 wherein said Group IIIA compound comprises yttrium aluminum garnet, YAG.

7. The method of claim 1 wherein said single crystal element is sapphire.

8. The method of claim 1 further comprising the step of cooling said heated assembly.

9. An article comprising a plurality of single crystal elements eutectically bonded to one another at least at one interface by one of an yttrium-containing compound and a derivative thereof.

10. The article of claim 9 wherein said yttrium-containing compound comprises yttrium aluminum garnet.

11. The article of claim 10 wherein said yttrium aluminum garnet comprises $Al_2O_3$ and $Y_2O_3$.

12. The article of claim 11 wherein said $Y_2O_3$ is present in the amount of about 81.5% by weight and $Al_2O_3$ is present in the amount of about 18.5% by weight.

13. The article of claim 9 wherein said yttrium-containing compound comprises yttria.

14. The article of claim 9 wherein said yttrium-containing compound comprises a yttrium aluminum garnet containing eutectic powder.

15. The article of claim 9 wherein said yttrium-containing compound comprises $Al_2O_3$ and $Y_2O_3$.

16. The article of claim 9 wherein said single crystal element comprises sapphire.

17. The article of claim 9 wherein said yttrium-containing compound comprises a slurry formed of 4 parts $Y_2O_3$ by weight and one part of a carrier fluid by weight.

18. The article of claim 17 wherein said carrier fluid comprises methanol.

19. The article of claim 9 wherein said yttrium-containing compound comprises a slurry formed of 4 parts yttrium aluminum garnet by weight and one part of a carrier fluid by weight.

20. An article comprising a plurality of single crystal elements eutectically bonded to one another at least at one interface by one of a mixture of Group IIIA and Group IIIB compound, and oxides, and derivative thereof.

21. The article of claim 20 wherein said single crystal element comprises sapphire.

22. The article of claim 20 wherein said Group IIIA compound comprises an yttrium-containing compound.

23. The article of claim 22 wherein said yttrium-containing compound comprises yttria.

24. The article of claim 22 wherein said yttrium-containing compound comprises $Y_3Al_5O_{12}$.

25. The article of claim 22 wherein said yttrium-containing compound comprises a slurry formed of 4 parts $Y_2O_3$ by weight and one part of a carrier fluid by weight.

26. The article of claim 22 wherein said yttrium-containing compound comprises a slurry formed of 4 parts yttrium aluminum garnet by weight and one part of a carrier fluid by weight.

* * * * *